United States Patent [19]

Slump

[11] Patent Number: 4,516,111
[45] Date of Patent: May 7, 1985

[54] PULSEWIDTH MODULATED, CHARGE TRANSFER, DIGITAL TO ANALOG CONVERTER

[75] Inventor: William R. Slump, Glen Rock, N.J.

[73] Assignee: The United States of America as represented by the Secretary of the Navy, Washington, D.C.

[21] Appl. No.: 394,233

[22] Filed: Jul. 1, 1982

[51] Int. Cl.³ .............................................. H03K 13/02
[52] U.S. Cl. ........................ 340/347 DA; 340/347 SH
[58] Field of Search ...... 340/347 DA, 347 C, 347 SH

[56] References Cited

U.S. PATENT DOCUMENTS

| | | | |
|---|---|---|---|
| 2,817,704 | 12/1957 | Huntley | 340/347 C |
| 3,140,481 | 7/1964 | Hoffman | 340/347 C |
| 3,449,741 | 6/1969 | Egerton | 340/347 C |
| 3,646,545 | 2/1972 | Naydan | 340/347 DA |
| 4,384,277 | 5/1983 | Allgood | 340/347 C |

Primary Examiner—Charles D. Miller
Attorney, Agent, or Firm—Robert F. Beers; Thomas M. Phillips

[57] ABSTRACT

A microprocessor-driven pulsewidth modulated, charge transfer, digital to analog converter for use in a sample data system. During the sample period a capacitor is charged to an error signal value which is the difference between the output of an operational amplifier and an average DC voltage proportional to the sampled digital data.

During the hold mode, the charge on the capacitor is transferred to a capacitor of smaller value connected between the input and output of the operational amplifier. This provides an error update during the hold period, permitting the circuit to be used with a computer on a time shared basis.

3 Claims, 1 Drawing Figure

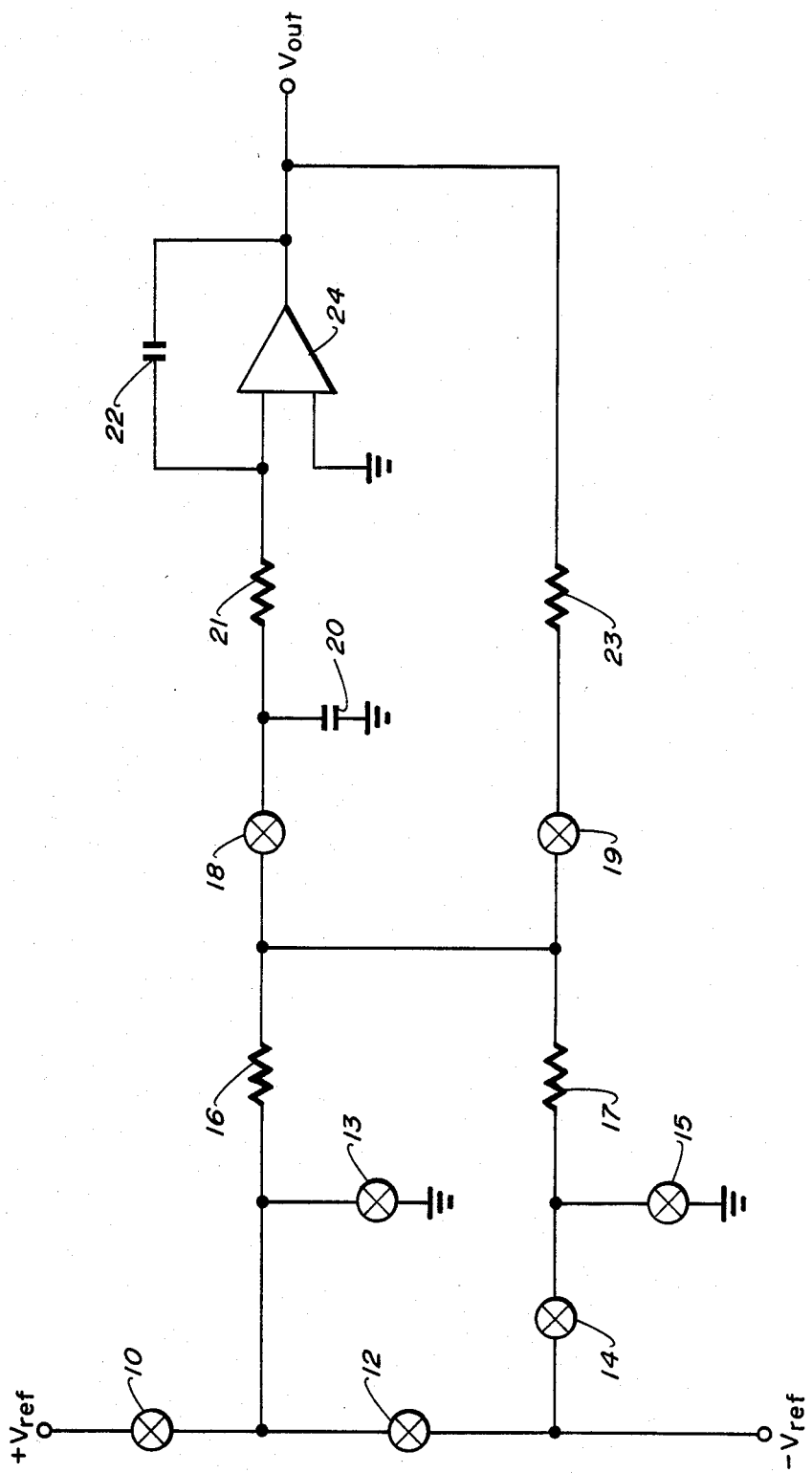

PULSEWIDTH MODULATED, CHARGE TRANSFER, DIGITAL TO ANALOG CONVERTER

BACKGROUND OF THE INVENTION

The present invention relates to digital to analog conversion apparatus and more particularly to pulsewidth modulated, charge transfer digital to analog conversion apparatus. U.S. Pat. No. 3,646,545 discloses a charge-gated digital to analog converter. The digital input signal is provided to an analog signal generating circuit, including a counter, which on command, generates an analog signal in the form of a pulsewidth which is a representation of the magnitude of the digital input signal and is a proportion of a predetermined maximum pulsewidth. U.S. Pat. No. 3,707,713 shows a high resolution pulse rate modulated digital to analog conversion system wherein means are provided for generating intermediate encoded digital signals which are a function of the binary digital data located in stored digital intelligence means. Monolithic digital to analog converters in this application require holding registers and output amplifiers. The resultant space utilization with these components is very inefficient. Pulsewidth modulated digital to analog converters satisfy the performance requirements when operated in a continuous duty update mode but have extremely long time constants when operated in a sample data mode (as required in a conventional computer interface).

The present invention is an improvement over the prior art such as U.S. Pat. No. 3,646,545 which eliminates the need for a register and output amplifiers.

SUMMARY OF THE INVENTION

The present invention provides for a pulsewidth modulated, charged transfer, digital to analog converter for use in a sample data system. The present invention makes a pulsewidth digital to analog converter practical by eliminating long time constant effects by providing for a charge transfer during the hold cycle. A microcomputer supplies the control signals for sampling the data. During the sample period, a first capacitor is charged to a value representing an error signal. During the hold mode, the charge on the first capacitor is transferred to a second capacitor connected between the output of an operational amplifier (operational filter) and its input. This creates a gain in the error signal and appears at the output terminal of the operational amplifier. This gain effect during the hold time overcomes the loss in operation of the circuit which would have been the case in the usual hold mode of a normal sample data system.

Accordingly, an object of the invention is the provision of a microprocessor-driven pulsewidth modulated, charge transfer digital to analog converter for use in a sample data system wherein during the hold mode continuous updating of the error signal is provided.

Other objects, advantages and novel features of the invention will become apparent from the following detailed description of the invention when considered in conjunction with the accompanying drawing.

Referring to the drawing wherein there is shown in circuit diagram form the preferred embodiment of the invention. All switching control signals are provided by a microcomputer (not shown). Switches 10 and 12 control whether the positive reference voltage or the negative reference voltage is applied to the resistor network composed of resistors 16 and 17.

Coarse amplitude desired at the output is controlled by switch 13 while fine amplitude at the output is controlled by switches 14 and 15. For example, with an eight bit plus polarity conversion, the polarity will determine whether switches 10 or 12 is controlled and the four most significant bits control the coarse "on/off" ratio while the four least significant bits control the fine "on/off" ratio. Four bits results in 16 time periods which are the sum of $t_1$ and $t_2$ and the sum of $t_3$ and $t_4$. The "on/off" duty cycles produce DC level changes which are applied to the resistor network consisting of resistors 16 and 17 and which have an average value proportions to the eight bit digital number.

Switch 18 connects the voltage applied to resistors 16 and 17 to capacitor 20. Switches 18 and 19 connect the voltage applied to resistor 23 to capacitor 20. The voltage across capacitor 20 which is the difference between these two voltages is fed through resistor 21 to the input of the summing mode of operational amplifier 24. A capacitor 22 that is of a smaller value than capacitor 20 is connected between the output of operational amplifier 24 and its input to the summing mode.

The time cycle used to control operation of the circuit is shown in the following table:

| Switch | Coarse Sample | | Fine Sample | | Hold |
|---|---|---|---|---|---|
| | $t_1$ | $t_2$ | $t_3$ | $t_4$ | $t_5$ |
| 10 or 12 | ON | OFF | OFF | OFF | |
| 13 | OFF | ON | ON | ON | |
| 14 | OFF | OFF | ON | OFF | |
| 15 | ON | ON | OFF | ON | |
| 18 and 19 | ON | ON | ON | ON | OFF |

With switches 18 and 19 in the "on" state and the above described signal applied to resistors 16 and 17 and the output voltage, $V_{out}$, applied to resistor 23, there will be a resultant error signal appearing on capacitor 20 at the end of the $t_4$ period. At this instant, the sample periods have been completed. The converter is then placed in a "hold" mode by turning off switches 18 and 19. During this hold period, the charge on capacitor 20 leaks off through resistor 21 into the operational amplifier 24 in the summing mode. This results in an equivalent increase in charge on capacitor 22 due to the effects of the operational amplifier 24. The charge can be transferred from capacitor 20 to capacitor 22 because capacitor 22 is of a smaller value than capacitor 20. With the charge being transferred, the resultant output ($V_{out}$) change will be the sample error voltage multiplied by capacitor 20 and divided by capacitor 22. This creates a gain in the error signal which existed at the end of $t_4$ and appears at the $V_{out}$ terminal. This gain effect during the hold-time overcomes the loss in operation of the circuit which would have been the case in the usual "hold" of a normal sample data system.

When the closed loop approaches a null, the charge on capacitor 20 will be zero at the end of $t_4$, $V_{out}$ then will be directly proportional to $V_{ref}$.

An additional feature of the invention is the simplicity of acquiring multiple outputs. The coarse/fine switch controls can be common to all outputs. As many charge transfer circuits as required may be connected in parallel to switches 18 and 19.

The circuit embodying the present invention uniquely provides an error update during the "hold period" thereby permitting the circuit to be used with a computer which performs many functions other than servicing a pulsewidth digital to analog converter. Generally, pulsewidth digital to analog converters cannot be used with a computer because of their service requirements which is eliminated by the present invention.

Obviously many modifications and variations of the present invention are possible in the light of the above teachings. It is therefore to be understood that within the scope of the appended claims the invention may be practiced otherwise than as specifically described.

I claim:

1. A pulsewidth modulated, charge transfer, digital to analog converter for use in sample data systems comprising in combination:
   an operational amplifier operating in the summing (filter) mode,
   a first capacitor connected between the input and output of said operational amplifier,
   a second capacitor adapted to be connected to a data source during sample periods and being disconnected therefrom during hold periods,
   circuit means for transferring the charge on said second capacitor to said first capacitor during said hold periods, and
   a feedback circuit connecting the output of said operational amplifier to said second capacitor during sample periods and disconnecting the output of said operational amplifier from said second capacitor during hold periods.

2. The converter of claim 1 wherein the charge on said second capacitor is the difference between the data source voltage and the output voltage of said operational amplifier.

3. The converter of claim 1 wherein said first capacitor is of a value less than said second capacitor.

* * * * *